(12) United States Patent
Taguchi et al.

(10) Patent No.: US 8,334,461 B2
(45) Date of Patent: Dec. 18, 2012

(54) WIRING BOARD AND ELECTRONIC COMPONENT DEVICE

(75) Inventors: Yuichi Taguchi, Nagano (JP); Teruaki Chino, Nagano (JP); Kiyoshi Oi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 611 days.

(21) Appl. No.: 12/262,442

(22) Filed: Oct. 31, 2008

(65) Prior Publication Data

US 2009/0141464 A1 Jun. 4, 2009

(30) Foreign Application Priority Data

Nov. 29, 2007 (JP) ................................. 2007-308238

(51) Int. Cl.
*H05K 1/00* (2006.01)
*H05K 1/11* (2006.01)
*H05K 7/00* (2006.01)

(52) U.S. Cl. ........ 174/252; 174/262; 174/264; 174/265; 174/266; 361/760; 361/783

(58) Field of Classification Search .................. 174/260, 174/262–266, 252, 255; 361/792–795, 761, 361/760, 767, 783
See application file for complete search history.

(56) References Cited

U.S. PATENT DOCUMENTS

| | | | | |
|---|---|---|---|---|
| 5,758,413 A * | 6/1998 | Chong et al. | ..................... | 29/852 |
| 6,333,565 B1 * | 12/2001 | Hashimoto | ................... | 257/781 |
| 6,418,615 B1 | 7/2002 | Rokugawa | | |
| 6,441,314 B2 | 8/2002 | Rokugawa | | |
| 6,931,724 B2 | 8/2005 | Rokugawa | | |
| 2002/0100967 A1 * | 8/2002 | Gaku et al. | ..................... | 257/707 |
| 2002/0195272 A1 * | 12/2002 | Rokugawa et al. | ........... | 174/262 |
| 2003/0178722 A1 * | 9/2003 | Xie et al. | ....................... | 257/724 |
| 2004/0124535 A1 * | 7/2004 | Chang | ............................ | 257/758 |
| 2004/0195686 A1 * | 10/2004 | Jobetto et al. | ................. | 257/734 |
| 2005/0006744 A1 * | 1/2005 | Ooi et al. | ....................... | 257/686 |
| 2005/0016768 A1 * | 1/2005 | Zollo et al. | .................... | 174/262 |
| 2005/0017271 A1 | 1/2005 | Rokugawa | | |
| 2005/0057906 A1 * | 3/2005 | Nakatani et al. | .............. | 361/771 |
| 2005/0155791 A1 * | 7/2005 | Saiki | ............................. | 174/262 |
| 2005/0211465 A1 * | 9/2005 | Sunohara et al. | ............. | 174/260 |

(Continued)

FOREIGN PATENT DOCUMENTS

JP 11-340362 12/1999

(Continued)

OTHER PUBLICATIONS

European Search Report dated Oct. 22, 2009.
Japanese Office Action issued in counterpart application No. 2007-308238 mailed Aug. 21, 2012 with English translation (4 pages).

*Primary Examiner* — Timothy Thompson
*Assistant Examiner* — Sherman Ng
(74) *Attorney, Agent, or Firm* — Kratz, Quintos & Hanson, LLP (57) ABSTRACT

A wiring board adapted for mounting an electronic component has the form of a structure in which a plurality of wiring layers are stacked one on top of another with an insulating layer interposed therebetween and are interconnected through via holes formed in the insulating layers, respectively. A plurality of openings are formed through the structure in a region where a wiring is not formed, extending through the structure in a thickness direction thereof. Further, solder resist layers are formed on the outermost wiring layers, respectively, and exposing pad portions defined in desired locations in the outermost wiring layers.

8 Claims, 8 Drawing Sheets

U.S. PATENT DOCUMENTS

| | | | |
|---|---|---|---|
| 2006/0108143 A1* | 5/2006 | Hsu et al. | 174/255 |
| 2007/0045815 A1* | 3/2007 | Urashima et al. | 257/698 |
| 2007/0124924 A1 | 6/2007 | Nakamura | 29/830 |
| 2007/0281394 A1* | 12/2007 | Kawabe et al. | 438/118 |
| 2008/0149384 A1* | 6/2008 | Kawabe | 174/265 |

FOREIGN PATENT DOCUMENTS

| | | |
|---|---|---|
| JP | 2000-323613 | 11/2000 |
| JP | 2003-282779 | 10/2003 |
| JP | 2007-158174 | 6/2007 |

\* cited by examiner

FIG. 1A
PLAN VIEW

FIG. 1B
SECTIONAL VIEW ALONG A-A LINE

FIG. 2A

PLAN VIEW

FIG. 2B

SECTIONAL VIEW ALONG A-A LINE

CHIP MOUNTING

FIG. 8B

UNDERFILL RESIN FILLING (THERMOSETTING)

WIRING BOARD AND ELECTRONIC COMPONENT DEVICE

CROSS-REFERENCE TO RELATED APPLICATIONS

This application is based on and claims priority of Japanese Patent Application No. 2007-308238 filed on Nov. 29, 2007, the entire contents of which are incorporated herein by reference.

BACKGROUND OF THE INVENTION (a) Field of the Invention

The present invention relates to a wiring board for use in mounting an electronic component such as a semiconductor device. More particularly, the present invention relates to a wiring board (hereinafter referred to also as a "semiconductor package") adapted for mounting an electronic component using a thermosetting material, the wiring board having a structure in which a plurality of wiring layers are stacked one on top of another with an insulating layer interposed therebetween and are interconnected through via holes formed in the insulating layer, and to an electronic component device including the wiring board with an electronic component mounted thereon.

(b) Description of the Related Art

Heretofore, build-up process has been widely used as a technology for manufacturing a wiring board of multilayer structure. With the use of the build-up process, a variety of multilayer wiring boards can be fabricated by varying the combination of a material (typically, a resin) for an interlayer dielectric and a via hole formation process. A typical manufacturing process for the multilayer wiring board using the build-up process is to repeat, in turn, the formation of an insulating layer, the formation of a via hole in the insulating layer, and the formation of a wiring pattern on the insulating layer and also in the via hole, on both surfaces or either one surface of a core substrate serving as a support base member. In such a structure, wiring layers and insulating layers can be thinly formed since the build-up process is used for their stacking, while the core substrate requires an appropriate thickness for affording the wiring board rigidity. This leads to a limitation to making the entire semiconductor package thinner.

Thus, a structure without a core substrate (support base member) has recently been adopted to make a wiring board (semiconductor package) to still thinner. The wiring board of such a structure is also called a "coreless substrate" in the meaning that it has no "core" portion. Although description is given later with respect to a method of manufacturing such a coreless substrate, the basic process thereof includes: preparing a temporary substrate as a support; forming, in sequence, a desired number of build-up layers (namely, insulating layers including via holes, and wiring patterns including the insides of the via holes) on the temporary substrate; and removing the temporary substrate (support).

An example of the technology related to the above conventional art is disclosed in Japanese unexamined Patent Publication (Kokai) 2000-323613. The technology disclosed in this publication provides a multilayer wiring board for a semiconductor device, and in the multilayer wiring board, a mounting surface for mounting the semiconductor device is formed as flat and thin as possible.

As mentioned above, the conventional coreless substrate (semiconductor package) has an advantage of allowing a reduction in thickness thereof since it does not need a core substrate. On the other hand, the conventional coreless substrate has a disadvantage of being prone to "warpage" since the absence of the core substrate affords the overall package low rigidity.

Figure 8A:
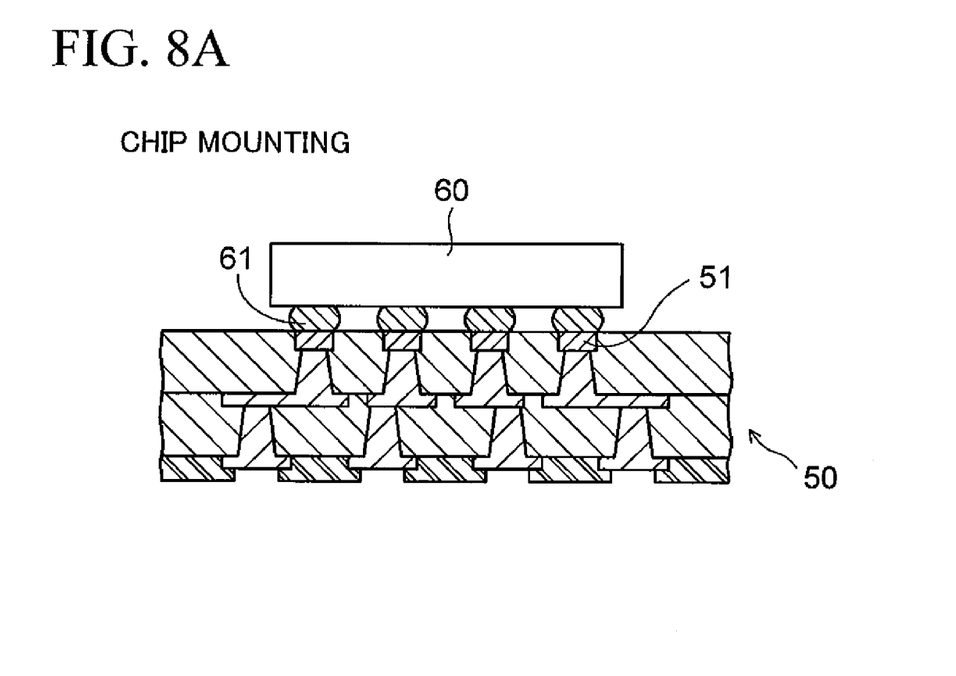
FIGS. 8A and 8B are views for explaining a problem inherent in a conventional coreless substrate.
Figure 8B:
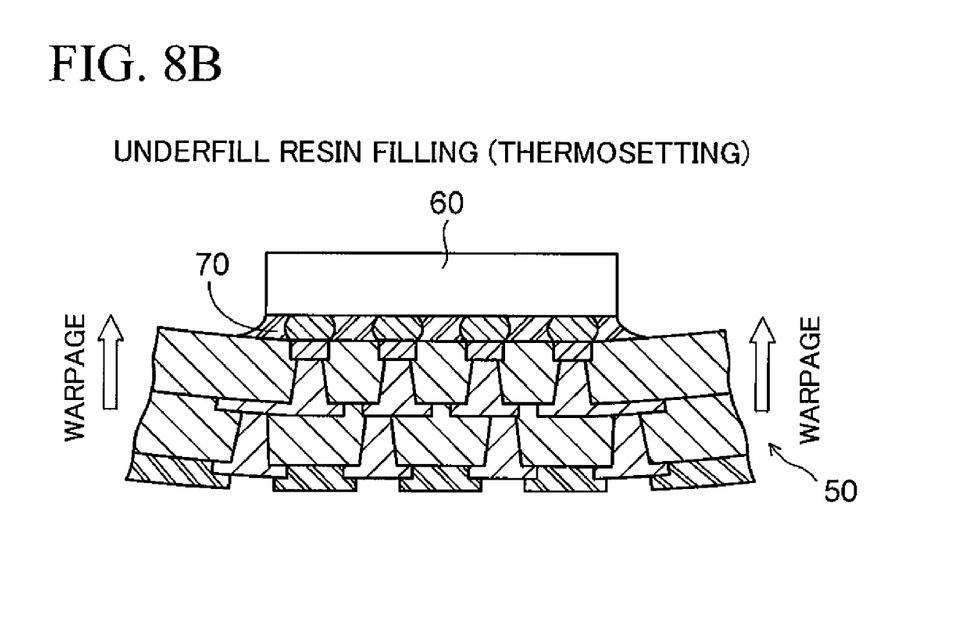

This problem develops more markedly when a chip is mounted on the substrate. FIGS. 8A and 8B show an example of the problem.

First, as shown in FIG. 8A, bumps (electrode terminals) 61 are formed on a chip 60 to be mounted on a coreless substrate 50. Thereafter, the electrode terminals 61 of the chip 60 are electrically connected to pad portions 51 exposed from one surface (in the illustrated example, the upper side surface) of the coreless substrate 50 (namely, flip chip bonding). Then, as shown in FIG. 8B, an underfill resin 70 is filled into a gap between the substrate 50 and the chip 60 to thereby insulate and shield the contact portion therebetween (namely, the pad portions 51 and the electrode terminals 61) from the outside. At that time, the underfill resin 70 is subjected to baking (namely, heat treatment) in order to undergo heat curing; however, the coefficient of thermal expansion of the underfill resin 70 is different from that of the substrate 50, and thus, as shown in FIG. 8B, the underfill resin 70 shrinks, so that the periphery of the substrate 50 is warped upward (namely, toward the chip 60).

Thus in the structure of the conventional coreless substrate (semiconductor package), on the occasion of chip mounting, the "warpage" occurs resulting from the low rigidity of the overall package and can possibly cause chip delamination depending on the degree of warpage, which in turn leads to a problem of making it impossible to implement the chip mounting with a high degree of reliability.

Additionally, the timing of the warpage to occur in the substrate is not limited to only the time of chip mounting, and the warpage may possibly occur even at stages before chip mounting. For example, in the case where a careless substrate is delivered to customer sites and then a chip is mounted thereon on the customer's premises, the warpage can possibly occur in the substrate, depending on how the substrate is handled during the processes from the delivery to the mounting, because the coreless substrate is intrinsically low in rigidity and flexible.

Moreover, this problem is not always unique to the coreless substrate and may possibly arise likewise in a build-up multilayer wiring board having the core substrate. Specifically, the coefficient of thermal expansion of a material constituting the wiring layer, such as copper (Cu), is significantly different from that of a material constituting the insulating layer, such as an epoxy resin. Thus, the application of the approach of building up the wiring and insulating layers alternatingly with one on top of another to one surface of the core substrate at given intervals of time (namely, the build-up process) can possibly induce thermal stress at the interface between the wiring layer and the insulating layer in the thickness direction of the layers according to the difference in the coefficient of thermal expansion during the process of building up. As a result, the warpage may occur in the substrate.

SUMMARY OF THE INVENTION

An object of the present invention is to provide a wiring board and an electronic component device, which are capable of effectively reducing warpage in a substrate that can possibly occur at the time of mounting of an electronic component such as a semiconductor device or at other times, to thereby contribute to highly-reliable mounting.

According to the fundamental aspect of the invention, there is provided a wiring board adapted for mounting an electronic component, including: a structure having a plurality of wiring layers stacked one on top of another with an insulating layer interposed therebetween, and interconnected through a via hole formed in the insulating layer, wherein a plurality of openings are formed through the structure in a region where a wiring is not formed, extending through the structure in a thickness direction thereof.

In the configuration of the wiring board according to the present invention, the plurality of openings are formed in a predetermined region (namely, the region where a wiring is not formed). Thus, the openings can cut off a stress transmitting (propagating) through the substrate, the stress (namely, the stress that can possibly cause warpage in the substrate) being induced, for example, according to a difference in the coefficient of thermal expansion between the wiring board and a thermosetting material at the interface therebetween even when an electronic component is mounted on the wiring board using the thermosetting material. This enables effective reduction in the warpage in the overall substrate, thus eliminating a disadvantage of chip "delamination" such as observed in the conventional technology. In other words, this enables a contribution to highly-reliable mounting.

Moreover, the above-described wiring board may further include solder resist layers formed on the outermost wiring layers, respectively, and exposing pad portions defined in desired locations therefrom. In this case, the wiring board is covered on both sides with the solder resist layers. Accordingly, the overall substrate is reinforced, which in turn leads to a further suppression of the warpage in the overall substrate and thus to enhancement of handling ease at the time of mounting of the electronic component.

Also, according to another aspect of the present invention, there is provided an electronic component device including: the wiring board according to the above aspect; and an electronic component mounted on the wiring board with a thermosetting material interposed therebetween, wherein the plurality of openings are filled with part of the thermosetting material.

Description is given of other constructional features and advantages based thereon, and the like, of the wiring board and the electronic component device according to the present invention with reference to embodiments of the present invention to be described hereinafter.

BRIEF DESCRIPTION OF THE DRAWINGS

FIGS. 1A and 1B show the configuration of a wiring board (semiconductor package) according to one embodiment of the present invention.

FIGS. 2A and 2B show the configuration of a wiring board (semiconductor package) according to another embodiment of the present invention.

FIG. 3B is a view corresponding to the embodiment shown in FIG. 2A;

DESCRIPTION OF THE PREFERRED EMBODIMENTS

Description is given below of preferred embodiments of the present invention with reference to the accompanying drawings.

Figure 1A:
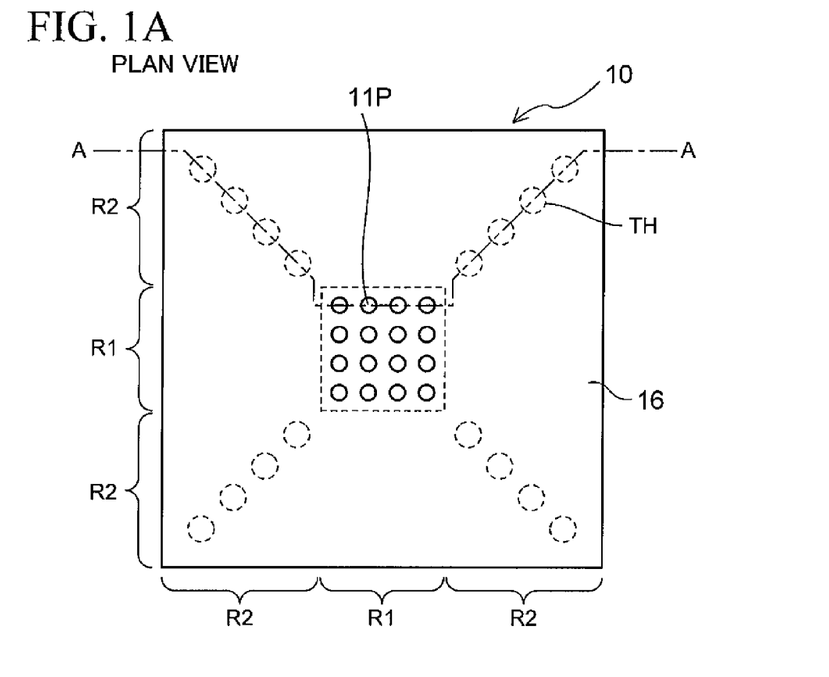
FIG. 1A is a plan view thereof.
Figure 1B:
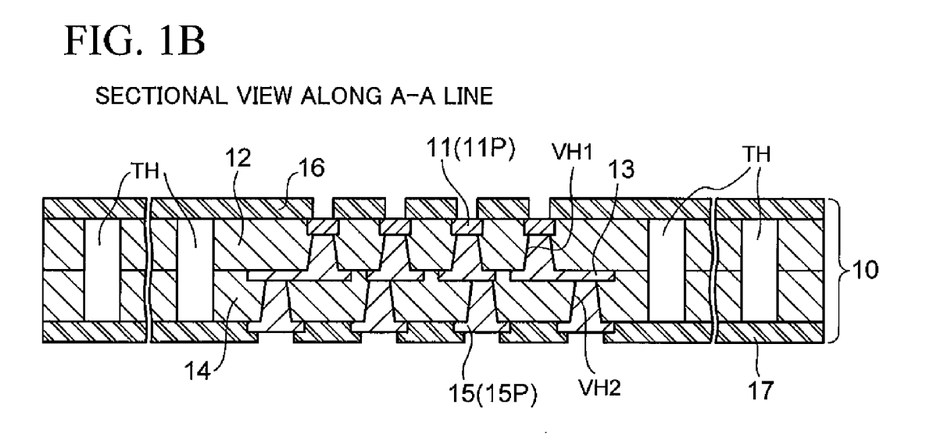
FIG. 1B is a sectional view taken along the A-A line of FIG. 1A.

FIGS. 1A and 1B show the configuration of a wiring board (semiconductor package) according to one embodiment of the present invention. FIG. 1A is a plan view of the wiring board 10 as viewed from the upper side thereof (namely, the side on which a semiconductor device (chip) is mounted as an electronic component), and FIG. 1B is a sectional view of the wiring board 10 as viewed along the A-A line of FIG. 1A.

As shown in FIG. 1B, the wiring board 10 according to this embodiment has the form of a structure in which a plurality of wiring layers 11, 13 and 15 are stacked one on top of another with insulating layers 12 and 14 interposed therebetween, and are interconnected through conductors (each of which forms part of a material constituting the wiring layers 13 and 15) filled into via holes VH1 and VH2 formed in the insulating layers 12 and 14, respectively. In other words, the wiring board 10 does not include a support base member, and has the form of a "coreless substrate". As shown in FIG. 1A, the coreless substrate includes a wiring forming region R1 (an area shown by the dashed lines in FIG. 1A) defined by a portion corresponding to a chip mounting region, and a peripheral region R2 that lies outside the wiring forming region R1. In this embodiment, the dimensions of the coreless substrate (the wiring board 10) are set to 40 mm by 40 mm; the dimensions of the wiring forming region R1 defined in the central portion thereof are set to 10 mm by 10 mm; and the thickness of the substrate is set to approximately 300 μm.

Further, a plurality of openings (through holes TH) characterizing the present invention are formed through the coreless substrate in portions where a wiring is not formed, extending through the substrate in a thickness direction thereof. The formation of the through holes TH can be accomplished by performing a holing process using a laser, a machine drill, or the like, at predetermined locations of a coreless substrate, after the fabrication of the coreless substrate by a given process as described later. The through holes TH are each formed with a diameter of approximately 80 μm to 1000 μm. In the illustrated example, four through holes TH are formed in each diagonal direction in the peripheral region R2 (namely, 16 through holes TH are formed in total).

Basically, it is desirable that the through holes TH be formed in the peripheral region R2 outside the wiring forming region R1; however, the through holes TH may be formed within the wiring forming region R1 (a portion in which a wiring is not formed), depending on the layout of wiring to be formed therein. It is essential only that the through holes TH be formed in such an arrangement as to cut off propagation of a stress through the substrate, the stress (namely, the stress that can possibly cause occurrence of warpage in the substrate) being induced according to a difference in the coefficient of thermal expansion between the wiring board and an underfill resin (thermosetting material) at the interface therebetween when a chip is mounted on the wiring board 10 using the underfill resin.

Further, insulating layers (solder resist layers) 16 and 17 to function as protection films are formed on the surface layers of the coreless substrate (namely, on top and bottom of the coreless substrate) so as to cover the surface layers throughout the entire area, exclusive of pad portions 11P and 15P defined by predetermined portions, respectively, of the outermost wiring layers (in the illustrated example, the wiring layers 11 and 15). Electrode terminals of the chip to be mounted on the wiring board 10 are to be flip-chip bonded via solder bumps or the like to the pad portions lip exposed from the upper insulating layer 16, while external connection terminals (metal balls, metal pins, or the like) for use in mounting the wiring board 10 on a motherboard or the like are to be bonded with solder or the like to the pad portions 15P exposed from the lower insulating layer 17.

The insulating layers (solder resist layers) 16 and 17 formed on both surfaces of the coreless substrate have the function as reinforcing layers, in addition to the function as the protection films. Namely, although depending on the number of through holes TH to be formed therein or the size thereof, the strength of the substrate can possibly deteriorate due to the presence of the through holes TH, because the wiring board 10 according to this embodiment is the low-rigidity coreless substrate and is also thin in thickness. In this embodiment, therefore, the insulating layers 16 and 17 are formed on both surfaces of the coreless substrate as shown in FIG. 1B to reinforce the substrate, after the formation of the through holes TH in desired locations.

Specific description is given of materials and so on for the members which constitute the wiring board 10 according to this embodiment, in connection with the process described below.

Hereinbelow, description is given with reference to FIGS. 6A to 7C illustrating manufacturing steps in a method of manufacturing a coreless substrate which forms the basic structure of the present wiring board 10. Incidentally, the method of manufacturing a coreless substrate itself does not characterize the present invention. As mentioned above, the provision of the through holes TH (see FIGS. 1A and 1B) in predetermined locations on the coreless substrate fabricated through the process characterizes the present invention.

Figure 6A:
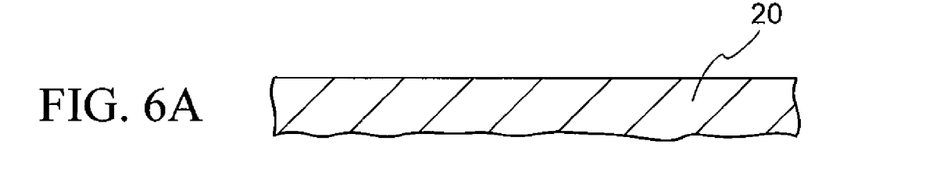
FIGS. 6A to 6F are sectional views showing manufacturing steps for a typical coreless substrate.
Figure 6B:
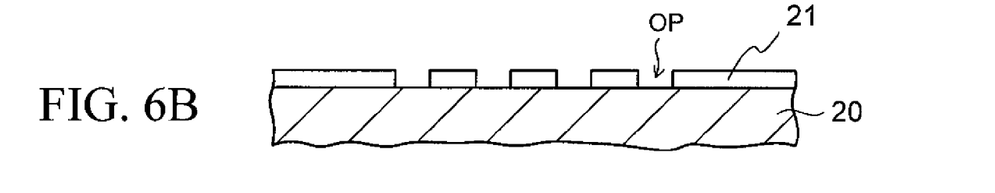
Figure 6C:
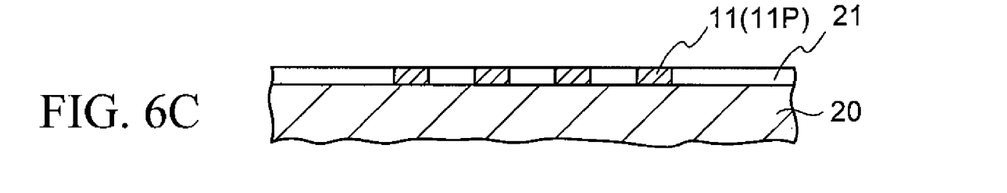
Figure 6D:
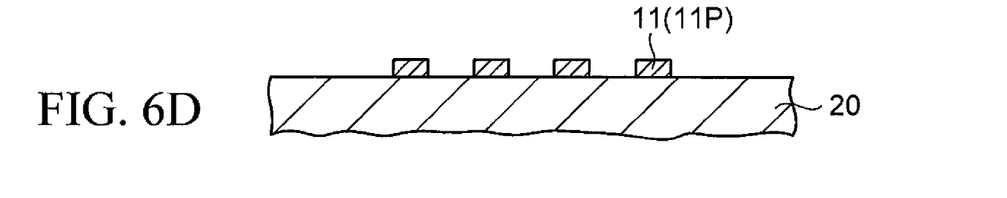

First, the first step (FIG. PA) involves preparing a support base member 20 as a temporary substrate. Taking into consideration that the support base member 20 is finally etched away as is described later, a metal (typically, copper (Cu)) soluble in an etching solution is used as a material for the support base member 20. Also, a metal plate or a metal foil is basically appropriate for use as a form of the support base member 20; however, specifically, the support base member 20 may be used in such a form as is disclosed for example in Japanese unexamined Patent Publication (Kokai)2007-158174, "method of manufacturing wiring board and method of manufacturing electronic component mounting structure," previously proposed by the present applicant. Specifically, a structure formed by disposing an underlying layer and a copper foil on a prepreg (i.e., an adhesive sheet in a semicured B stage, formed by impregnating a thermosetting resin such as an epoxy resin or a polyimide resin into glass cloth that is a reinforcement material) and then applying heat and pressure to the prepreg, may be preferably used as the support base member 20.

The next step (FIG. 6B) involves: forming a plating resist on the support base member 20, using a patterning material; and forming an opening in a predetermined location. This opening portion is formed by patterning according to a desired shape of a wiring layer (pattern) to be formed. A photosensitive dry film or a liquid photoresist can be used as the patterning material. For example, where the dry film is used, the formation of the resist involves: cleaning the surface of the support base member 20; then attaching the dry film onto the support base member 20 by thermocompression bonding; curing the dry film by subjecting the dry film to exposure under ultraviolet (UV) irradiation using a mask (not shown) formed by patterning in the desired shape of the wiring layer; and further, etching away the exposed portion using a predetermined developing solution (namely, forming an opening OP). Thereby, a plating resist layer 21 is formed according to the desired shape of the wiring layer (pattern). Where the liquid photoresist is used, the plating resist layer 21 can be likewise formed through the like steps.

The next step (FIG. 6C) involves forming the wiring layer 11 on the support base member (Cu) 20 exposed through the opening OP in the plating resist layer 21, by electroplating using the support base member 20 as a power feed layer. The wiring layer 11 functions as the pad portion 11P to mount the semiconductor device (chip). Taking into consideration that the support base member 20 in contact with the wiring layer 11 is finally etched away, a metal species insoluble in an etching solution is selected as a material for the wiring layer 11 (pad portion 11P). In this embodiment, since copper (Cu) is used as the material for the support base member 20, gold (Au) is used as the material for the wiring layer 11 as a different metal from copper, in considering that it can ensure good electrical conductivity. Further, on the Au plating layer, nickel (Ni) plating is carried out. This is for enhancing adhesion of the copper (Cu) wiring layer onto the wiring layer 11 (pad portion 11P) connected thereto at the later stage, and for preventing Cu from diffusing into Au. In other words, at this step, the pad portion lip having a two-layer structure of the Au plated layer and the Ni plated layer is formed.

The next step (FIG. 6D) involves removing the plating resist layer 21, for example, using an alkaline chemical liquid such as sodium hydroxide or a monoethanolamine solution.

Figure 6E:
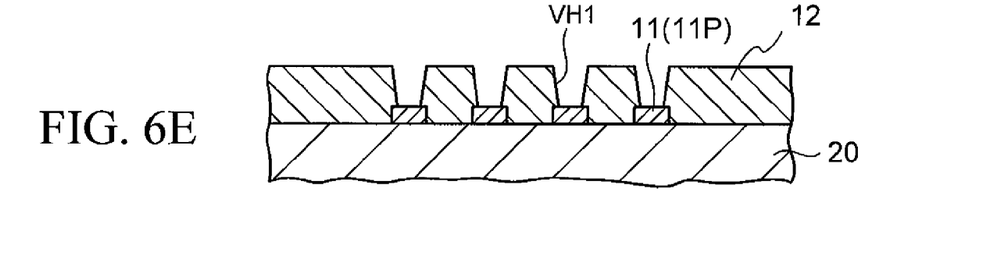

The next step (FIG. GE) involves, first, forming the insulating layer 12 on the support base member 20 and the wiring layer 11 (pad portion 11P). An epoxy resin, a polyimide resin, or the like is used as a material for the insulating layer 12. The formation of the insulating layer 12 can be accomplished for example by laminating an epoxy-resin film on the support base member 20 and the wiring layer 11 (pad portion lip), and then curing the resin film by subjecting the resin film to heat treatment at a temperature of 130 to 150° C., while pressing the resin film. Then, in this step, the via hole VH1 is formed by subjecting the insulating layer 12 to laser or other processing so that the wiring layer 11 (pad portion 11P) on the support base member 20 is exposed. Incidentally, the insulating layer 12 may be formed by subjecting a photosensitive resin film to patterning by photolithography, or may be formed by subjecting a resin film provided with an opening to patterning by screen printing.

The next step (FIG. 6F) involves forming the wiring layer (pattern) 13 on the insulating layer 12 having the via hole VH1 formed therein by the filling of the via hole VH1, the wiring layer (pattern) 13 being connected to the wiring layer 11 (pad portion 11P). For example, a semi-additive process is used for formation of the wiring layer 13. Specifically, a copper (Cu) seed layer (not shown) is first formed on the insulating layer 12 and also in the via hole VH1 by electroless plating, sputtering, or the like. Then, a resist film (not shown) is formed, which has an opening according to the shape of the wiring layer 13 to be formed. Subsequently, a conductor (Cu) pattern (not shown) is formed on the seed layer (Cu) exposed through the opening in the resist film, by copper (Cu) electroplating using the seed layer as a power feed layer. Further, the resist film is removed, and then, the seed layer is etched using the conductor (Cu) pattern as a mask, thereby yielding the desired wiring layer 13. Incidentally, besides the above semi-additive process, various wiring forming methods such as a subtractive process or the like may be used.

Figure 6F:
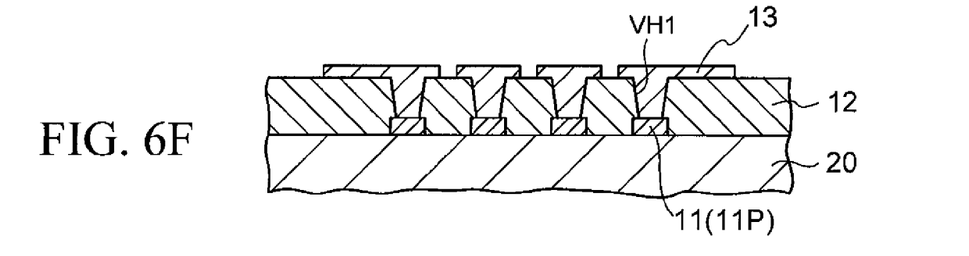
Figure 7A:
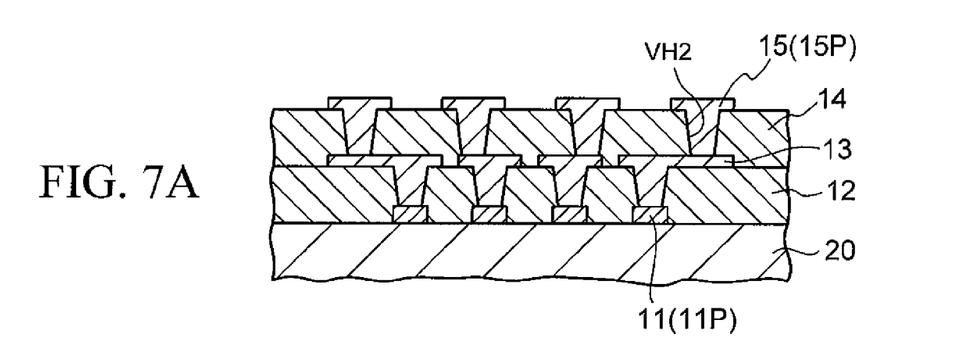
FIGS. 7A to 7C are sectional views showing manufacturing steps following the steps in FIGS. 6A to 6F.
Figure 7B:
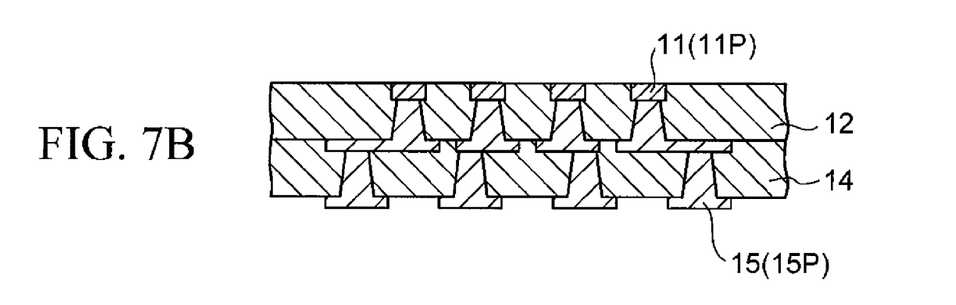
Figure 7C:
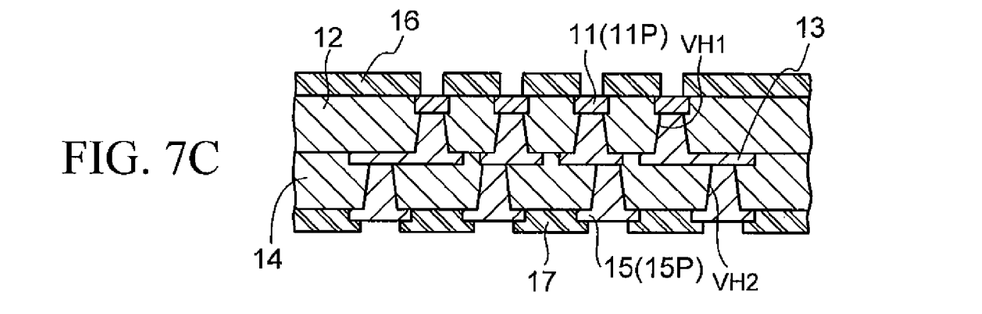

The next step (FIG. 7A) involves stacking the insulating layers and the wiring layers in multilayer in the same manner as the process performed at the steps shown in FIGS. 6E and 6F. In the illustrated example, one insulating layer and one wiring layer are stacked for the simplicity of description. Specifically, the insulating layer 14 is formed on the insulating layer 12 and the wiring layer 13. The via hole VH2 extending to the pad portion (not shown) of the wiring layer 13 is formed in the insulating layer 14. Thereafter, the desired wiring layer (pattern) 15 is formed on the insulating layer 14 and also in the via hole VH2. In this embodiment, the wiring layer (Cu) 15 is the outermost wiring layer. It is therefore desirable that the wiring layer 15 be given Au plating for purposes of improvement in contact characteristics, since the pad portion 15P defined in a predetermined location on the wiring layer 15 has bonding to the external contact terminal (a solder ball or the like) for use in mounting the wiring board on the motherboard or the like. On that occasion, the wiring layer (Cu) 15 is given the Au plating after having been given Ni plating. In other words, a conductor layer (not shown) formed of a two-layer structure of the Ni plated layer and the Au plated layer is formed on the wiring layer 15.

The next step (FIG. 7B) involves selectively removing the support base member 20 (FIG. 7A) from the wiring layers 11 and 15 and the insulating layers 12 and 14. For example, wet etching using a ferric chloride aqueous solution, a cupric chloride aqueous solution, an ammonium persulfate aqueous solution, or the like can be used to selectively etch away the support base member (Cu) 20 from the wiring layers 11 and 15 (each having the Au plated layer formed at its surface portion) and the insulating layers 12 and 14. Incidentally, these layers are shown as being upside down in the illustrated example. In this case, the upper side of this wiring board is a surface for mounting a chip component such as a semiconductor device (i.e., a chip mounting surface), while the lower side is a surface to be mounted on the motherboard or the like (i.e., an external-connection-terminal bonding surface).

After that, in this embodiment, the through holes TH (FIGS. 1A and 1B) are formed by, for example, a holing process using a machine drill, a $CO_2$ laser, a YAG laser or the like, at predetermined locations of the coreless substrate fabricated through the above process.

The final step (FIG. 7C) involves forming the solder resist layers 16 and 17 so as to cover the surface layers (namely, the insulating layers 12 and 14 and the wiring layers 11 and 15) throughout the entire area, exclusive of the pad portions 11P and 15P defined on the outermost wiring layers 11 and 15, respectively. The solder resist layers 16 and 17 can be formed in the same manner as the process performed at the step in FIG. 6B. Specifically, the formation of the solder resist layers 16 and 17 can be accomplished by laminating a photosensitive dry film or coating a liquid photoresist, and forming the resist in a predetermined shape by patterning.

By the above steps, the wiring board 10 (FIGS. 1A and 1B) according to this embodiment is fabricated.

As described above, with the configuration of the wiring board (semiconductor package) 10 according to this embodiment, the plural through holes TH are formed in the desired arrangement in the predetermined location (namely, the peripheral region R2) on the package. Accordingly, even when the use of the underfill resin for chip mounting on this package induces a stress (namely, a stress that can possibly cause the warpage in the substrate) at the interface between the package and the underfill resin according to the difference in the coefficient of thermal expansion therebetween, the through holes TH are capable of cutting off the stress propagating through the substrate. This enables an effective reduction in the warpage in the overall substrate. As a result, the disadvantage of chip "delamination" such as observed in the conventional technology can be eliminated, and thus highly reliable chip mounting is achieved.

In addition, the coreless substrate (wiring board 10) is covered on both sides with the solder resist layers 16 and 17. Namely, the overall substrate is reinforced, which in turn leads to a further suppression of the warpage in the overall substrate, and thus to enhancement of the handling ease at the time of chip mounting.

Figure 2A:
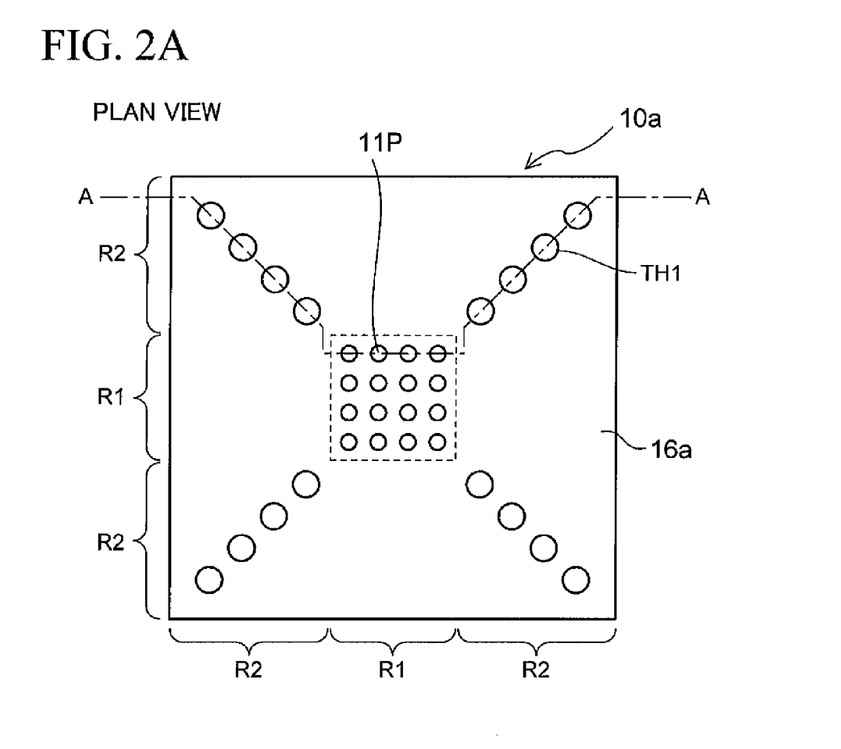
FIG. 2A is a plan view thereof.
Figure 2B:
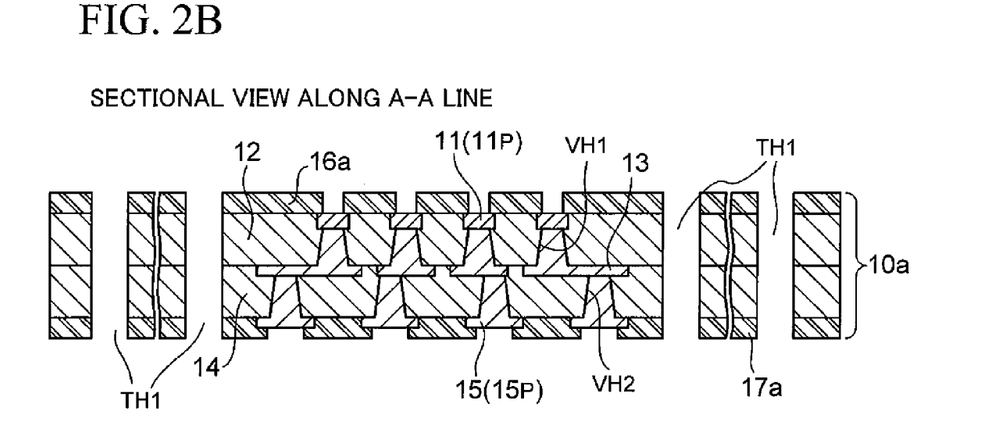
FIG. 2B is a sectional view taken along the A-A line of FIG. 2A.

The configuration of the wiring board (semiconductor package) 10 according to the above-mentioned embodiment is described taking the case where, after the formation of the through holes TH in the coreless substrate, the coreless substrate is covered on both sides with the solder resist layers 16 and 17 (namely, the case where the through holes TH are not exposed to the outside). However, as is apparent from the gist of the present invention, it is to be, of course, understood that the through holes TH may be exposed to the outside. FIGS. 2A and 2B show another embodiment in which through holes are exposed to the outside.

The configuration of a wiring board 10a according to this embodiment (FIGS. 2A and 2B) is different from that of the wiring board 10 according to the above-mentioned embodiment (FIGS. 1A and 1B), in that through holes TH1 formed in the coreless substrate at predetermined locations are exposed to the outside. Specifically, in this embodiment, the formation of the wiring board 10a is accomplished by fabricating a coreless substrate through the process as shown in FIGS. 6A to 6F and FIG. 7A, removing the support base member 20, thereafter forming solder resist layers 16a and 17a on both surfaces of the coreless substrate, and forming the through holes TH1 in the coreless substrate at the predetermined locations. Since the configuration of other structural components is the same as that of the embodiment shown in FIGS. 1A and 1B, description thereof is omitted.

With the configuration of the wiring board (semiconductor package) 10a according to this embodiment shown in FIGS. 2A and 2B, the presence of the through holes TH1 formed at the predetermined locations enables achieving the same advantageous effects (namely, a reduction in the warpage in the substrate, highly-reliable mounting, reinforcement of the overall package, and so on), as in the case of the wiring board (semiconductor package) 10 according to the embodiment shown in FIGS. 1A and 1B.

Additionally, the above-mentioned embodiments (the wiring boards 10 and 10a) are described taking the case where the openings formed in the coreless substrate at the predetermined locations are in the form of the through holes (circular holes) TH and TH1; however, it is to be, of course, understood that the shape of the opening is not limited to this. It is essential only that the openings have such a shape as to cut off propagation of a stress through the substrate, the stress (namely, the stress that can possibly cause occurrence of warpage in the substrate) being induced according to a difference in the coefficient of thermal expansion between the wiring board and a underfill resin (thermosetting material) at the interface therebetween when a chip is mounted on the wiring board using the underfill resin. The opening may have a thin and long form (namely, slit form), as shown for example in FIGS. 3A and 3B.

Figure 3A:
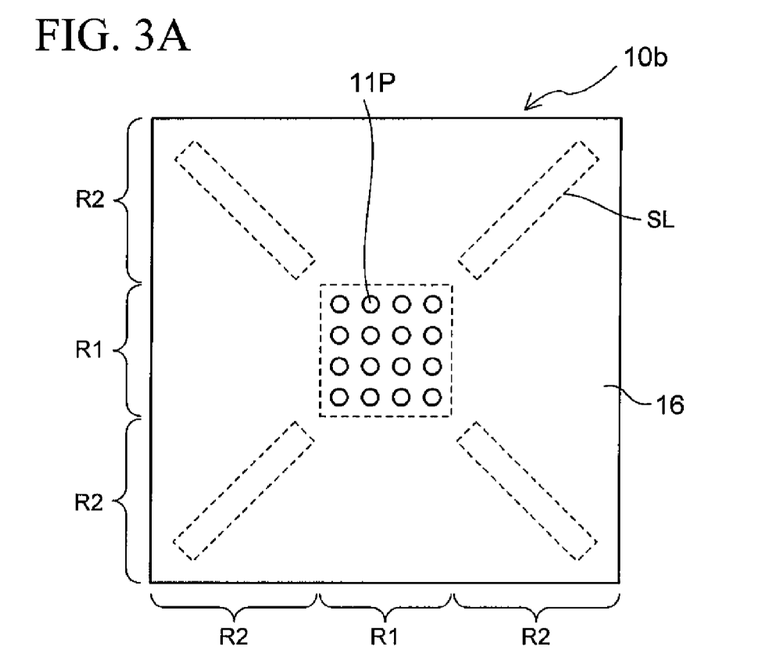
FIGS. 3A and 3B show modified embodiments, specifically, of openings formed in the wiring board, FIG. 3A are a view corresponding to the embodiment shown in FIG. 1A.
Figure 3B:
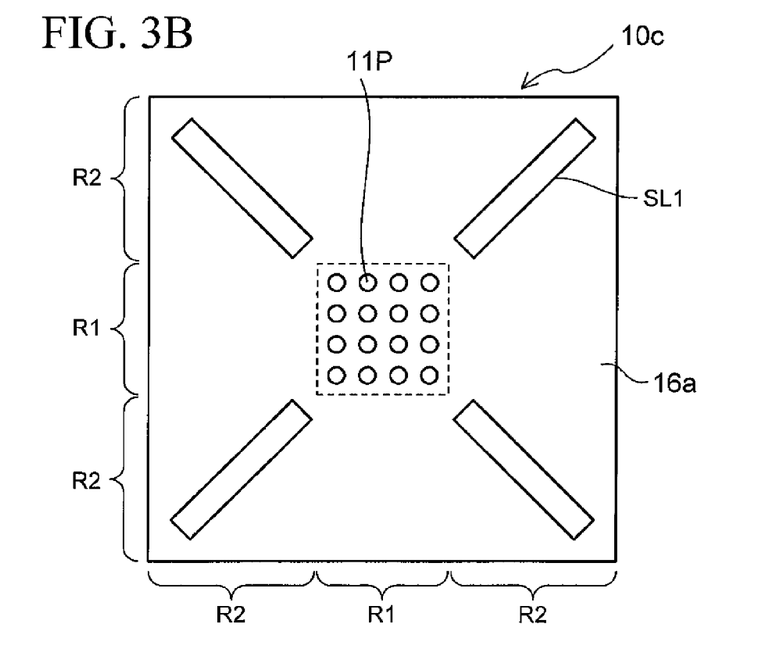

A wiring board 10b shown in FIG. 3A is a wiring board in which one slit SL in place of the four through holes TH in the wiring board 10 according to the embodiment shown in FIG. 1A is formed in each diagonal direction. On the other hand, a wiring board 10c shown in FIG. 3B is a wiring board in which one slit SL1 in place of the four through holes TH1 in the wiring board 10a according to the embodiment shown in FIG. 2A is formed in each diagonal direction. The formation of the slits SL and SL1 can be accomplished by forming a plurality of through holes in each diagonal direction and linking the through holes together. The dimensions of the slits SL and SL1 thus formed are such that the width thereof lies between approximately 80 μm and 1000 μm, and the length thereof lies between approximately 0.08 mm and 20 mm.

Figure 4A:
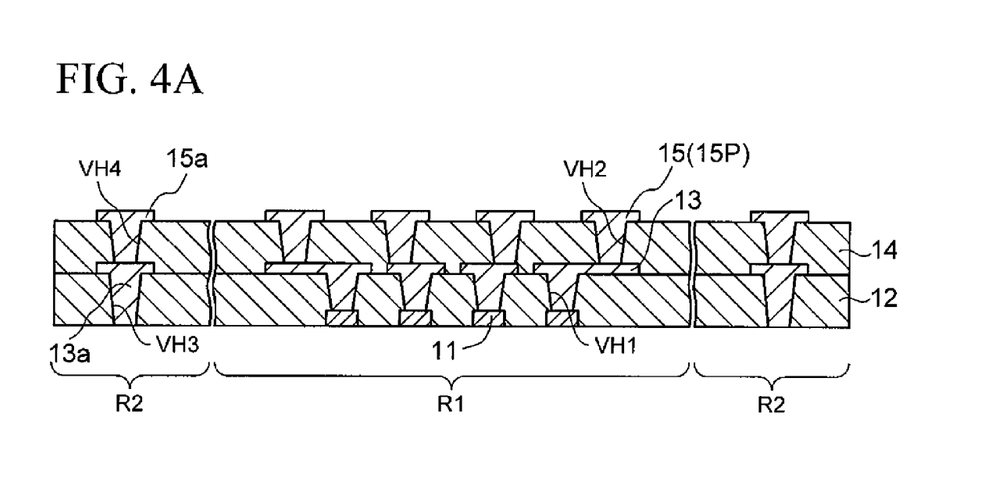
FIGS. 4A and 4B are views for explaining another method for forming the openings (through holes) in the embodiments shown in FIGS. 1A and 1B and FIGS. 2A and 2B.
Figure 4B:
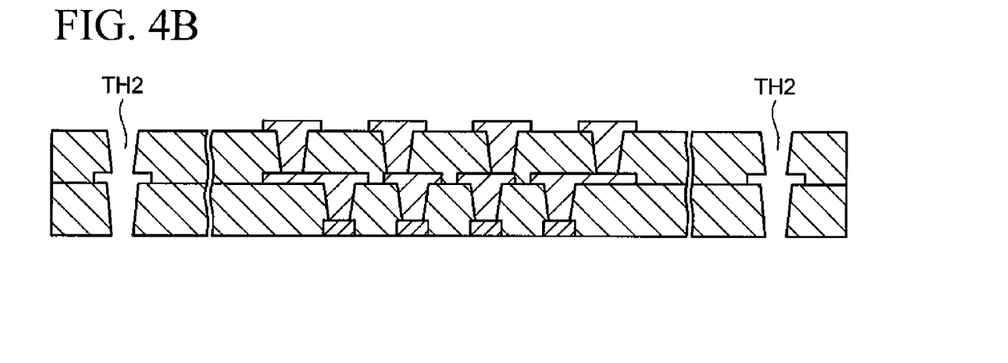

The embodiments shown in FIGS. 1A and 1B and FIGS. 2A and 2B are described taking the case where the laser or the machine drill is used for the formation of the through holes TH and TH1; however, it is to be, of course, understood that a method for the formation of the through holes is not limited to this, and other methods may be used. FIGS. 4A and 4B show one example of such methods.

As shown in FIG. 4A, in this method, the via holes VH1 and VH2 for interconnection are first formed respectively in the insulating layers 12 and 14 in the wiring forming region R1, and are filled with the conductors (Cu). At the same time, via holes VH3 and VH4 for the through holes are formed respectively in the insulating layers 12 and 14 in the peripheral region R2, and are filled with conductors (Cu) 13a and 15a. The via holes for the through holes are stacked one on top of another to form a "stack via" structure as illustrated. In this instance, of the wiring layers 13 and 15 formed by the filling of the via holes VH1 and VH2 for interconnection with the conductors, the wiring layer 15 (pad portion 15P) exposed to the outside is given Ni/Au plating at the surface portion as described in connection with the step in FIG. 7A. Meanwhile, of the conductors (Cu) filled into the via holes VH8 and VH4 for the through holes, the conductor exposed to the outside is left unprocessed, In other words, the metal exposed to the outside is Au for the conductors filled into the via holes VH1 and VH2 for interconnection, while the metal exposed to the outside is Cu for the conductors filled into the via holes VH3 and VH4 for the through holes.

In this state, the conductors (Cu) 13a and 15a respectively filled into the via holes VH3 and VH4 for the through holes are selectively etched away while the conductors (Au) on the surface portions, filled into the via holes VH1 and VH2 for interconnection, are unetched. Thereby, through holes TH2 are formed in the etched locations as shown in FIG. 4B. A selective etching method is the same as the process performed at the step in FIG. 7C.

This method is effective in forming through holes in such a small (or limited) region that through holes cannot be formed with the machine drill, since it uses a via hole formation process generally used in the build-up process, whereas the above-mentioned method using the machine drill does no more than form a through hole of approximately 80 μm at the smallest.

Figure 5:
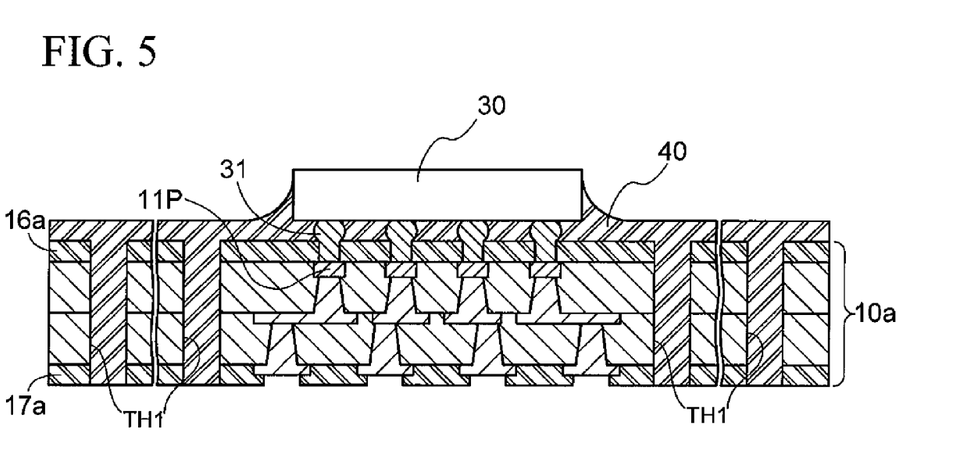
FIG. 5 is a sectional view showing the configuration of an electronic component device using the wiring board according to the embodiment shown in FIGS. 2A and 2B.

FIG. 5 shows a configuration example for delivering the wiring board (semiconductor package) according to the above-mentioned embodiment on which an electronic component such as a chip is mounted. Specifically, FIG. 5 shows the configuration (a cross section) of an electronic component device using the wiring board 10a according to the embodiment shown in FIGS. 2A and 2B.

In mounting an electronic component (chip 30), bumps (electrode terminals) 31 are first formed on the chip 30. Thereafter, the electrode terminals 31 of the chip 30 are connected to the pad portions 11P exposed from one surface (the upper surface in the illustrated example) of the wiring board 10a by flip chip bonding. Then, an underfill resin 40 is filled into a gap between the wiring board 10a and the chip 30. The underfill resin 40 is cured by heating to thereby fix (or mount) the chip 30. A generally-used liquid epoxy resin or the like is used as the underfill resin 40. The liquid epoxy resin has a modulus of elasticity of 5 to 15 GPa, a coefficient of thermal expansion (CTE) of 20 to 40 ppm/° C. and a content of approximately 60% to 80% filler added thereto. Preferably, underfill flow molding is used as a filling method for the resin 40. Besides this, injection molding or other methods may be used.

In the configuration example shown in FIG. 5, the wiring board (semiconductor package) 10a is covered on both sides with the solder resist layers 16a and 17a. Thereby, the overall package is reinforced. Furthermore, when the chip 30 is mounted on the wiring board 10a, the underfill resin 40 is filled also into the through holes TH1 of the wiring board 10a and cured therein so that the effect of reinforcement can be enhanced.

Incidentally, FIG. 5 shows the configuration example in which the underfill resin 40 is used for fixing (or mounting) of the chip 30; however, besides the underfill resin, a molding resin may be used for the fixing of the chip 30. In this case, transfer molding is performed on the wiring board 10a so as to seal the chip 30, and, on that occasion, the molding resin is filled into the through holes TH1. Meanwhile, in the illustrated example, the chip 30 is connected to the wiring board 10a by flip chip bonding; however, it is to be, of course, understood that wire bonding may be used as a mode of mounting the chip 30. In this case, likewise, transfer molding is performed on the wiring board 10a so as to seal a bonding wire and the chip 30, and, on that occasion, the molding resin is filled into the through holes TH1.

Moreover, FIG. 5 shows the configuration example for the delivery of the wiring board with the electronic component mounted thereon; however, the wiring board (semiconductor package) may be delivered without a chip mounted thereon. In this case, likewise, by filling and curing the molding resin or the underfill resin in the through holes TH1 of the wiring board 10a, the effect of reinforcement can be enhanced.

As for the wiring board (semiconductor package) 10 according to the embodiment shown in FIGS. 1A and 1B, although not particularly illustrated, the effect of reinforcement can be enhanced likewise, after the formation of the through holes TH in the coreless substrate, by coating the coreless substrate on both sides with the solder resist layers 16 and 17 to fill the through holes TH using the resist material.

What is claimed is:

1. A wiring board adapted for mounting an electronic component, comprising:
   a plurality of stacked wiring layers having an insulating layer interposed therebetween;
   a wiring forming region defined by a portion corresponding to a region where the electronic component is mounted; and
   a peripheral region around the wiring forming region,
   wherein, in the wiring forming region, the plurality of wiring layers are interconnected through a via hole formed in the insulating layer, and outermost wiring layers of the plurality of stacked wiring layers are provided on both surfaces of the wiring board, and wherein,
   in the peripheral region, a plurality of openings are formed in the insulating layer in a portion where a wiring of the wiring layer is not formed, with each opening being defined entirely by the insulating layer and being unfilled therein, and the plurality of openings extending from one outermost wiring layer to the other outermost wiring layer of the plurality of wiring layers of the wiring board in a thickness direction thereof.

2. The wiring board according to claim 1, wherein the plurality of openings are formed in such an arrangement as to cut off propagation of a stress being through the wiring board, the stress being induced according to a difference in the coefficient of thermal expansion between a thermosetting material and the wiring board at the interface therebetween when the electronic component is mounted on the wiring board using the thermosetting material.

3. The wiring board according to claim 1, further comprising solder resist layers formed on the outermost wiring layers, respectively, and exposing pad portions defined in the outermost wiring layers and exposing the plurality of openings.

4. An electronic component device comprising:
the wiring board according to claim 1; and
an electronic component mounted on the wiring board with a thermosetting material interposed in therebetween,
wherein the plurality of openings are filled with part of the thermosetting material.

5. The wiring board according to claim 1, further comprising solder resist layers formed on the outermost wiring layers, respectively, and exposing pad portions defined in the outermost wiring layers and covering the plurality of openings.

6. The wiring board according to claim 1, wherein the plurality of openings are formed in each diagonal direction in the peripheral region.

7. The wiring board according to claim 1, wherein each of the plurality of openings is provided in the form of a through hole.

8. The wiring board according to claim 1, wherein each of the plurality of openings is provided in the form of a slit.

* * * * *